United States Patent
Takahashi et al.

(10) Patent No.: US 6,838,744 B2
(45) Date of Patent: Jan. 4, 2005

(54) SEMICONDUCTOR DEVICE AND MANUFACTURING METHOD THEREOF

(75) Inventors: Hideki Takahashi, Tokyo (JP); Shinji Aono, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/273,116

(22) Filed: Oct. 18, 2002

(65) Prior Publication Data

US 2003/0218230 A1 Nov. 27, 2003

(30) Foreign Application Priority Data

May 22, 2002 (JP) ........................................ 2002-147227

(51) Int. Cl.$^7$ ........................ H01L 27/095; H01L 21/00
(52) U.S. Cl. ...................... 257/472; 257/471; 257/473; 438/92; 438/570; 438/571; 438/572
(58) Field of Search ............................... 257/471–486, 257/155, 156, 260, 622, 656; 438/570–572, 92, 575, 580, 582

(56) References Cited

U.S. PATENT DOCUMENTS

| | | | |
|---|---|---|---|
| 3,906,540 A | * | 9/1975 | Hollins ........................ 257/476 |
| 4,752,813 A | | 6/1988 | Bhatia et al. |
| 4,769,560 A | * | 9/1988 | Tani et al. .................... 307/315 |
| 5,101,244 A | * | 3/1992 | Mori et al. ..................... 357/15 |
| 5,389,815 A | * | 2/1995 | Takahashi .................... 257/605 |
| 5,569,614 A | | 10/1996 | Kataoka et al. |
| 6,455,403 B1 | * | 9/2002 | Hwang et al. ............... 438/576 |
| 6,501,146 B1 | * | 12/2002 | Harada ........................ 257/475 |

FOREIGN PATENT DOCUMENTS

JP  6-196723  * 7/1994

* cited by examiner

*Primary Examiner*—Donghee Kang
(74) *Attorney, Agent, or Firm*—Oblon, Spivak, McClelland, Maier & Neustadt, P.C.

(57) ABSTRACT

A semiconductor device and a manufacturing method therefor are provided, the semiconductor device having a good reverse recovery characteristic, and having no reduction in breakdown voltage because no defect occurs in the upper main surface of a Si substrate even when wires are bonded onto an anode electrode. A semiconductor device includes a Si substrate including an $N^+$ cathode layer and an $N^-$ layer. An impurity such as platinum whose barrier height is less than that of silicon is introduced into upper regions of the $N^-$ layer where P anode layers are not formed, thereby forming Schottky junction regions. A barrier metal is formed between the Si substrate and an anode electrode.

10 Claims, 5 Drawing Sheets

SEMICONDUCTOR DEVICE AND MANUFACTURING METHOD THEREOF

BACKGROUND OF THE INVENTION

1. Field of the Invention

The present invention relates to a Schottky barrier diode comprising a barrier metal between a wire-bonded electrode and a semiconductor substrate.

2. Description of the Background Art

FIG. 8 is a cross-sectional view of a conventional rectifier diode. In a Si substrate, a P anode layer 205 is formed on the upper surface of an N⁻ layer 202 and an anode electrode 203 is formed on the upper surface of the P anode layer 205. An N⁺ cathode layer 201 is formed on the rear surface of the N⁻ layer 202 and a cathode electrode 204 is formed on the rear surface of the N⁺ cathode layer 201.

FIG. 9 shows changes of current with respect to time when the diode of FIG. 8 is switched from its on state to its off state, i.e., during reverse recovery of the diode. Where IF is the value of steady-state current and IRR is the minimum value of current. The time during which a reverse current flows is referred to as a reverse recovery time TRR. A gently-sloping recovery of current from IRR to zero is referred to as soft recovery. Although not shown, a reverse voltage is applied to the diode during reverse recovery, and the product of reverse voltage and current is referred to as recovery loss.

In general, it is desirable for rectifier diodes to have small steady-state loss which is the product of forward voltage and current during the on state, to have small recovery loss, and to provide a soft recovery characteristic.

For the above requirements, a variety of diode structures have been suggested. A structure shown in FIG. 10 has been suggested in the Proceedings of the 1987 IEEE International Electron Devices Meeting, pp. 658–661, 1987. In a diode 200 of this structure, the P anode layers 205 are selectively formed in the upper main surface of the N⁻ layer 202 and Schottky junction regions 206 are formed in upper regions of the N⁻ layer 202 where the P anode layers 205 are not formed. The anode electrode 203 is formed on the upper surfaces of the P anode layers 205 and the Schottky junction regions 206. The P anode layers 205 and the anode electrode 203 are in ohmic contact. The N⁺ cathode layer 201 is formed on the rear surface of the N⁻ layer 202 and the cathode electrode 204 is formed on the rear surface of the N⁺ cathode layer 201.

Now, the operation of the diode 200 with the structure of FIG. 10 will be described. When a forward-biased anode voltage is applied between the anode electrode 203 and the cathode electrode 204 and increased beyond a predetermined threshold value, the Schottky junction regions 206 first enter the on state. The threshold voltage at this time varies depending on the barrier height of the Schottky junction, and it is lower than that which causes pn junction regions to enter the on state. Further, few holes are injected from the Schottky junction regions 206 into the N⁻ layer 202. If the anode voltage is further increased, hole injection from the P anode layers 205 into the N⁻ layer 202 starts and also causes pn junction regions to enter the on state. The diode 200 has few holes injected from the Schottky junction regions 206 into the N⁻ layer 202, and correspondingly, its carrier concentration in the vicinity of the anode is lower than that in a diode formed of only pn junctions. The value IRR at the reverse recovery is determined by the carrier concentration in the vicinity of the anode. In the diode 200 of FIG. 10, a low carrier concentration in the vicinity of the anode results in a small IRR, thereby reducing recovery loss and providing a soft recovery characteristic. That is, a reverse recovery characteristic of the diode is improved. The diode 200 can also relax electric fields applied across the Schottky junction regions 206 and can increase a reverse breakdown voltage by providing a reach-through of a depletion layer which extends from the selectively formed P anode layers 205 to the Schottky junction regions 206.

A diode disclosed in Japanese Patent Application Laid-open No. 58-60577 (1983) and shown in FIG. 11 has a structure in which the Schottky junction regions 206 in the diode of FIG. 10 are replaced by P anode layers 207 which are thin and have a low impurity concentration. This diode has no Schottky junction regions formed therein and thus the value IRR is not as small as that for the diode 200. Accordingly, the reverse recovery characteristic is not so improved.

A diode disclosed in Japanese Patent No. 2590284 and shown in FIG. 12 has a structure in which the P anode layers 207 in the diode of FIG. 11 are replaced by P anode layers 208 which are thinner than the P anode layers 207. The P anode layers 208 are formed by diffusing a P-type impurity contained in the anode electrode 203. This diode provides a Schottky characteristic for a forward voltage since the Schottky junction regions are formed in the upper main surface of the P anode layers 208.

A diode disclosed in Japanese Patent Application Laid-open No. 6-196723 (1994) and shown in FIG. 13 has been proposed by the inventor of the present invention who aimed to form Schottky junction regions 210 in upper regions of the N⁻ layer 202 where the P anode layers 205 are not formed, by forming a barrier metal 209 such as TiW between the Si substrate and the anode electrode 203. However, later research has shown that the Schottky junction regions 210 cannot be formed in the N⁻ layer 202 by merely forming the barrier metal 209 of TiW on the upper surface of the Si substrate.

According to the teaching of Japanese Patent No. 2590284, when wires are bonded onto the anode electrode 203, the diode 200 of FIG. 10 as a power device has defects caused by pressure at the interface between the anode electrode 203 and the Si substrate. Since electrons in the conduction band flow into those defects, leakage current increases with the application of a reverse bias voltage. This produces a problem of reducing the breakdown voltage.

The diode of FIG. 11 has no Schottky junction regions formed therein and is thus inferior in the reverse recovery characteristic to the diode 200 of FIG. 10.

The diode of FIG. 12, although having the Schottky junction regions formed therein, allows only a narrow margin for structure because of the very small thickness of the P anode layers 208 and is correspondingly difficult to manufacture.

The diode of FIG. 13 has no Schottky junction regions 210 formed therein when TiW is used for the barrier metal 209 formed on the upper surface of the Si substrate, and thus has a poor reverse recovery characteristic. The effectiveness of the barrier metal 209 for defects occurring in wire bonding has not been suggested in Japanese Patent Application Laid-Open No. 6-196723 (1994).

Japanese Patent Application Laid-open No. 2000-261004 has also disclosed a diode having a similar structure to that of FIG. 13, but it has not suggested the effectiveness of a barrier metal for defects occurring in wire bonding.

SUMMARY OF THE INVENTION

An object of the present invention is to provide a semiconductor device and a manufacturing method therefor, the semiconductor device having a good reverse recovery characteristic, and having no reduction in breakdown voltage since no defect occurs in the upper main surface of a Si substrate even when wires are bonded onto an anode electrode.

According to an aspect of the present invention, the semiconductor device includes a first semiconductor layer of a first conductivity type, second semiconductor layers of a second conductivity type, Schottky junction regions, a barrier metal layer, a first main electrode, a second main electrode, and a bonding wire. The second semiconductor layers are selectively formed in a surface of the first semiconductor layer. The Schottky junction regions are formed in regions of the surface of the first semiconductor layer where the second semiconductor layers are not formed. The barrier metal layer is formed on the second semiconductor layers and the Schottky junction regions. The first main electrode is formed on the barrier metal layer. The second main electrode is formed in a rear surface side of the first semiconductor layer. The bonding wire is bonded onto the first main electrode.

Since the barrier metal layer is formed on the surface of the first semiconductor layer, no defect occurs in the surface of the first semiconductor layer even with the pressure applied by wire bonding. This keeps a high breakdown voltage.

According to another aspect of the present invention, the method of manufacturing a semiconductor device includes the following steps (a) to (g). The step (a) is to prepare a first semiconductor layer of a first conductivity type. The step (b) is to selectively form second semiconductor layers of a second conductivity type in a surface of the first semiconductor layer. The step (c) is to form Schottky junction regions in regions of the surface of the first semiconductor layer where the second semiconductor layers are not formed. The step (d) is to form a barrier metal layer on the second semiconductor layers and the Schottky junction regions. The step (e) is to form a first main electrode on the barrier metal layer. The step (f) is to form a second main electrode in a rear surface side of the first semiconductor layer. The step (g) is to bond a bonding wire onto the first main electrode.

Since the barrier metal layer is formed on the surface of the first semiconductor layer, no defect occurs in the surface of the first semiconductor layer even with the pressure applied by wire bonding. This keeps a high breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
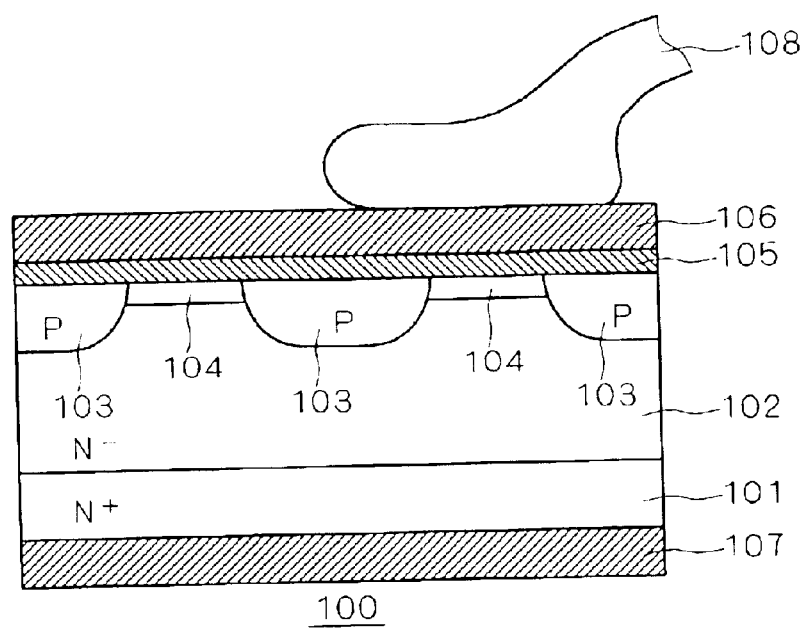
FIG. 1 is a diagram showing a diode structure according to a first preferred embodiment.

FIG. 1 is a cross-sectional view of a diode 100 according to a first preferred embodiment of the present invention. In the upper main surface of an N⁻ layer 102, P anode layers 103 are selectively formed. In upper regions of the N⁻ layer 102 where the P anode layers 103 are not formed, Schottky junction regions 104 are formed. The Schottky junction regions 104 contain silicide films formed by introducing into the surface of the N⁻ layer 102 an impurity such as platinum whose barrier height is less than that of silicon. These silicide films form Schottky junctions with the N⁻ layer 102.

While N⁻ type silicon and silicide film form a Schottky contact, P type silicon with a high impurity concentration and silicide film do not form a Schottky contact. Thus, even if silicide films are formed in the upper parts of the P anode layers 103, no Schottky junction region 104 is formed in the upper main surfaces of the P anode layers 103. From this, silicide films may or may not be formed in the upper parts of the P anode layers 103.

On the upper surfaces of the P anode layers 103 and the Schottky junction regions 104, a barrier metal 105 such as TiW is formed.

When the barrier metal 105 is formed of TiW, it is necessary to form silicide films in the surface of the N⁻ layer 102 for formation of the Schottky junction regions 104, because TiW and N⁻ type silicon do not form a Schottky contact. On the other hand, when the barrier metal 105 is formed of metal which forms a Schottky contact with N⁻ type silicon, the Schottky junction regions 104 can be formed in the surface of the N⁻ layer 102 without the need to form silicide films.

An anode electrode 106 is formed on the upper surface of the barrier metal 105. An N⁺ cathode layer 101 is formed on the rear surface of the N⁻ layer 102 and a cathode electrode 107 is formed on the rear surface of the N⁺ cathode layer 101. Further, a bonding wire 108 is bonded to the upper surface of the anode electrode 106.

Now, the operation of the diode 100 with the structure of FIG. 1 will be described. When a forward-biased anode voltage is applied between the anode electrode 106 and the cathode electrode 107 and increased beyond a predetermined threshold value, the Schottky junction regions 104 first enter the on state. The threshold voltage at this time varies depending on the barrier height of the Schottky junction, and it is lower than that which causes pn junction regions to enter the on state. Further, few holes are injected from the Schottky junction regions 104 into the N⁻ layer 102. If the anode voltage is further increased, hole injection from the P anode layer 103 into the N⁻ layer 102 starts and also causes pn junction regions to enter the on state. The diode 100 has few holes injected from the Schottky junction regions 104 into the N⁻ layer 102, and correspondingly, its carrier concentration in the vicinity of the anode is lower than that in a diode formed of only pn junctions. The value IRR at the reverse recovery is determined by the carrier concentration in the vicinity of the anode. In the diode 100 of FIG. 1, a low carrier concentration in the vicinity of the anode results in a small IRR, thereby reducing recovery loss and providing a soft recovery characteristic. That is, a reverse recovery characteristic of the diode is improved. The diode 100 can also relax electric fields applied across the Schottky junction regions 104 and can increase a reverse breakdown voltage by providing a reach-through of a depletion layer which extends from the selectively formed P anode layers 103 to the Schottky junction regions 104.

In this structure, the Schottky junction regions 104 are protected by forming the barrier metal 105 on the upper surface of the Si substrate. Thus, even when the bonding wire 108 is bonded to the anode electrode 106 in order to use the diode as a power device, no defect is caused by the applied pressure in the Schottky junction regions 104. To verify this, 43 diode chips of this structure, each measuring 17 mm by 10 mm, are prepared and 20 aluminum wires of 400 Φ are bonded to each of the chips. The barrier metal 105 is formed of TiW having a thickness of about 1500 Å. In measuring a reverse leakage current before and after bonding, none of the chips shows an increase in the reverse leakage current. This is believed to be due to the fact that the barrier metal 105 protects the Schottky junction regions 104 from the pressure applied by the wire bonding Also in this structure, the use of platinum as an impurity and the use of TiW as the barrier metal 105 reduce contact resistances between the silicide films or the barrier metal 105 and the P anode layers 103. To confirm this effect, contact resistances between the P anode layers 103 having a contact hole of 10 $\mu$m×10 $\mu$m and the anode electrode 106 are measured. The anode electrode 106 is formed of Al containing a small quantity of Si. When neither the barrier metal 105 nor silicide film is formed, the measured value varies from 3 to 7 k$\Omega$ and is large. On the other hand, when the barrier metal 105 of TiW and platinum silicide films are formed, the measured value varies little and is small, e.g., about 2 k$\Omega$; that is, the contact resistances are small and stable.

<Second Preferred Embodiment>

Figure 2:
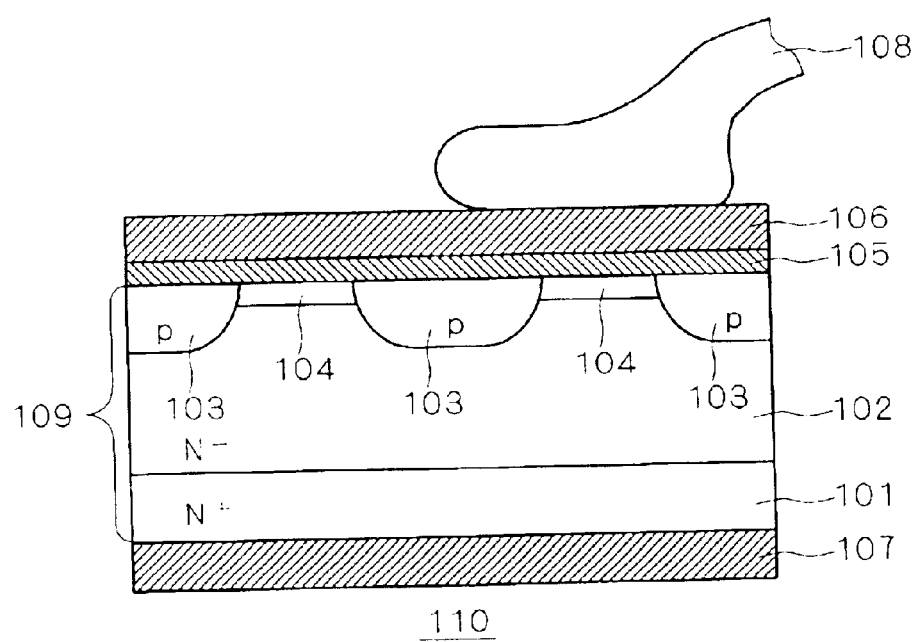
FIG. 2 is a diagram showing a diode structure according to a second preferred embodiment.

FIG. 2 is a cross-sectional view of a diode 110 according to a second preferred embodiment of the present invention, wherein platinum is diffused as a lifetime killer into the N$^-$ layer 102 of the diode 100 shown in FIG. 1. In some diffusion techniques, platinum may be diffused into the whole Si substrate 109 including the N$^+$ cathode layer 101, the N$^-$ layer 102, the P anode layers 103 and the Schottky junction regions 104. However, since carrier lifetime becomes an issue only for the N$^-$ layer 102, platinum may or may not be diffused into regions other than the N$^-$ layer 102.

Although the diffusion of platinum as a lifetime killer reduces carrier lifetime within the N$^-$ layer 102 and increases steady-state loss during the on state, it can shorten the reverse recovery time TRR and thus can reduce recovery loss. Thus, by increasing or reducing the amount of platinum diffusion, the total amount of losses for each type of product can be controlled to a minimum.

When silicide films formed in the Schottky junction regions 104 are platinum silicide films, the formation of silicide films and the addition of a lifetime killer can be made at the same time. This reduces the number of process steps in the manufacturing process.

<Third Preferred Embodiment>

Now, a preferable manufacturing method for the diodes 100 and 110 described in the first and second preferred embodiments will be described with reference to FIGS. 3 to 7.

Figure 3:
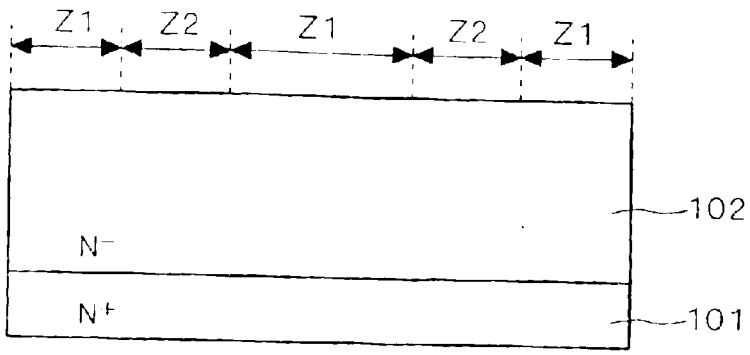
FIGS. 3 to 7 are diagrams showing the manufacturing process of a diode according to a third preferred embodiment.

First, as shown in FIG. 3, a silicon wafer substrate is prepared, which comprises an N$^+$ silicon layer to be the N$^+$ cathode layer 101 and an N$^-$ silicon layer to be the N$^-$ layer 102. The silicon wafer is divided into first portions Z1 where the P anode layers 103 are formed in a subsequent processing step and second portions Z2 where the P anode layers 103 are not formed.

Figure 4:
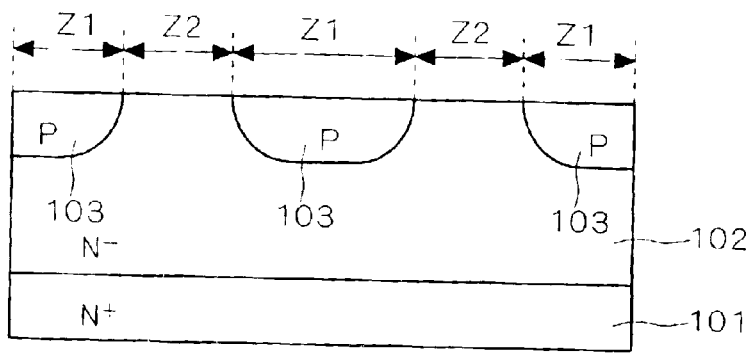

Then, as shown in FIG. 4, the surfaces of the second portions Z2 are covered with a resist (not shown) and P-type impurity ions are implanted from above the N$^-$ layer 102, after which the resist is removed. Thereby, the P anode layers 103 are formed in the upper main surfaces of the first portions Z1 of the N$^-$ layer 102.

Figure 5:
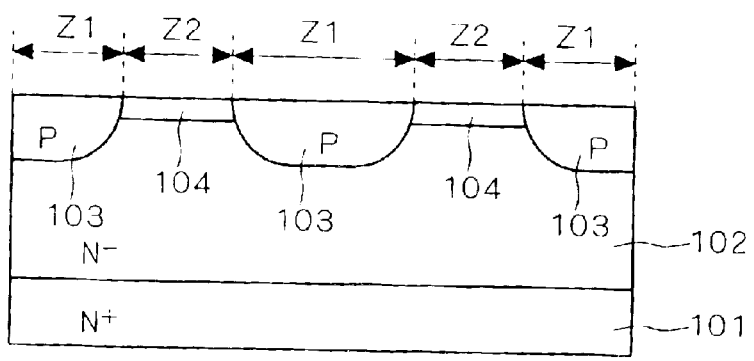

Then, as shown in FIG. 5, an impurity such as platinum is added from above the N$^-$ layer 102, thereby to form the Schottky junction regions 104 including silicide films in the vicinity of the surfaces of the second portions Z2 of the N$^-$ layer 102.

At this time, silicide films are also formed in the vicinity of the surfaces of the P anode layers 103 in the first portions Z1. However, since P type silicon in the P anode layers 103 has a high impurity concentration and thus does not form a Schottky contact with silicide films, no Schottky junction region 104 is formed in the vicinity of the surfaces of the P anode layers 103. Thus, silicide films may or may not exist within the P anode layers 103.

When platinum is used as an impurity, the added platinum can also be used as a lifetime killer by being diffused into the Si substrate (in the case of the diode 110). When metal other than platinum is used as an impurity, platinum may be separately added by sputtering and then diffused to be used as a lifetime killer in the diode 110.

Figure 6:
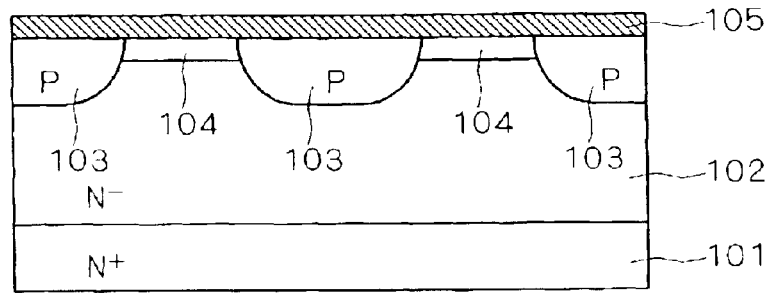

Then, as shown in FIG. 6, the barrier metal 105 is formed of, for example, TiW on the whole Si substrate.

When the barrier metal 105 is formed of TiW, it is necessary in FIG. 5 to form silicide films in the surface of the N$^-$ layer 102 for formation of the Schottky junction regions 104, because TiW and N$^-$ type silicon do not form a Schottky contact. When the barrier metal 105 is formed of metal which forms a Schottky contact with N$^-$ type silicon, the Schottky junction regions 104 can be formed in the surface of the N$^-$ layer 102 without the need to form silicide films.

Figure 7:
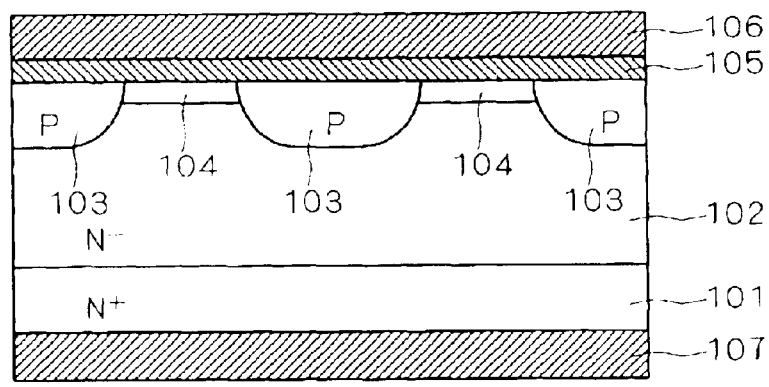
Figure 8:
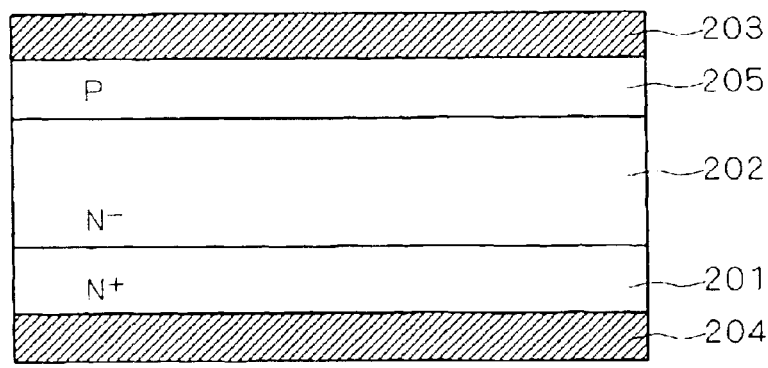
FIG. 8 is a diagram showing a conventional diode structure.
Figure 9:
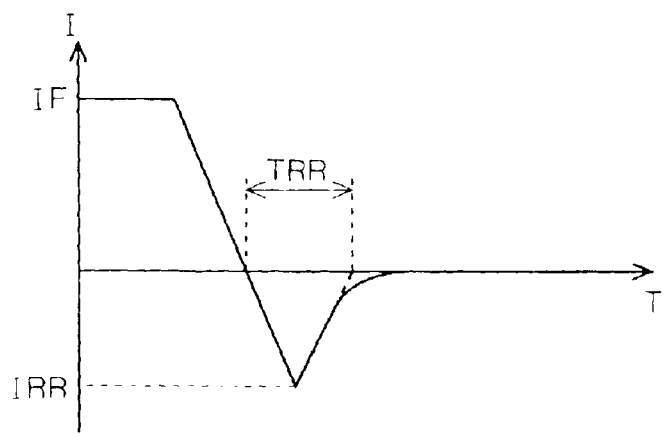
FIG. 9 is a diagram showing changes of current with respect to time in the conventional diode.
Figure 10:
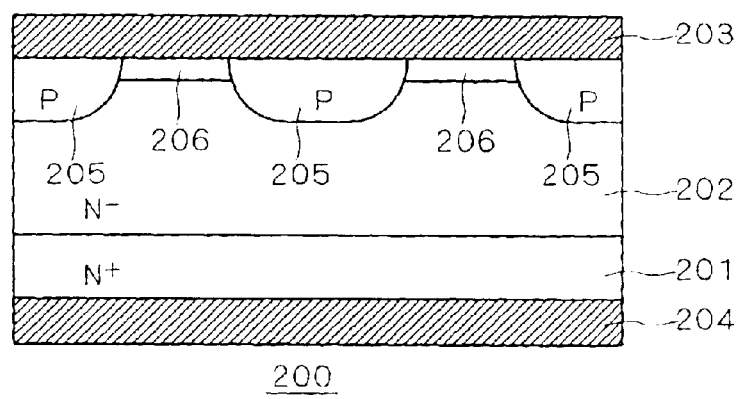
FIGS. 10 to 13 are diagrams showing conventional diode structures.
Figure 11:
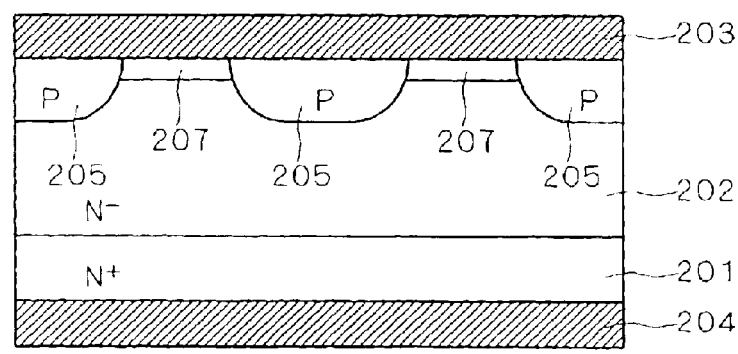
Figure 12:
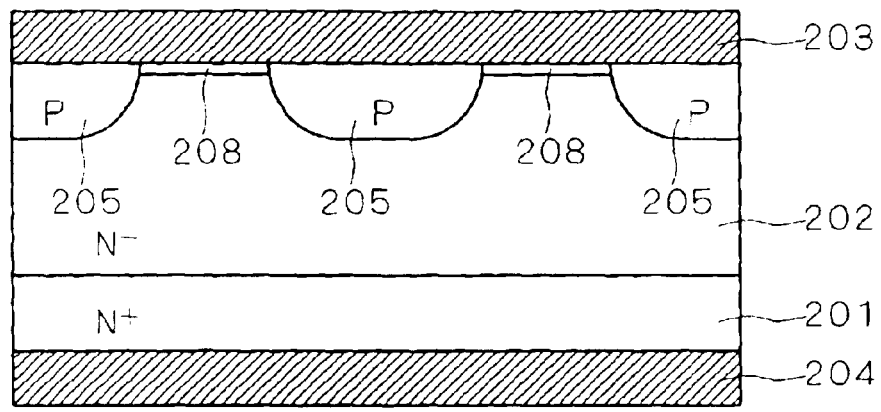
Figure 13:
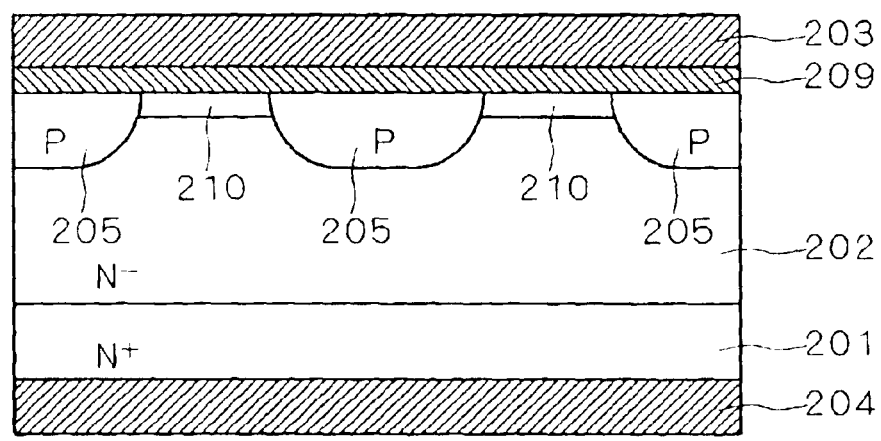

Then, as shown in FIG. 7, the anode electrode 106 is formed on the upper surface of the barrier metal 105 and the cathode electrode 107 is formed on the rear surface of the N$^+$ cathode layer 101. Further, wires are bonded onto the anode electrode 106, thereby completing the diodes 100 and 110.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first semiconductor layer of a first conductivity type;
   second semiconductor layers of a second conductivity type selectively formed in a surface of said first semiconductor layer;
   Schottky junction regions formed in regions of the surface of said first semiconductor layer where said second semiconductor layers are not formed;
   a barrier metal layer formed on said second semiconductor layers and said Schottky junction regions;
   a first main electrode formed on said barrier metal layer;
   a second main electrode formed in a rear surface side of said first semiconductor layer; and
   a bonding wire bonded onto said first main electrode at a position above at least one of said Schottky junction regions, so that said barrier metal layer intervenes between said bonding wire and said at least one of said Schottky junction regions, wherein said Schottky junction regions include platinum silicide films.

2. The semiconductor device according to claim 1, wherein said barrier metal layer is formed of an alloy of titanium and tungsten.

3. The semiconductor device according to claim 1, wherein said first semiconductor layer contains platinum as a lifetime killer.

4. The semiconductor device according to claim 1, wherein said barrier metal layer has a sufficient thickness to prevent defects in said Schottky junction regions caused by applied pressure from the bonding of the bonding wire onto the first main electrode.

5. The semiconductor device according to claim 4, wherein the thickness is about 1500 Å.

6. A method of manufacturing a semiconductor device, comprising the steps of:

(a) preparing a first semiconductor layer of a first conductivity type;

(b) selectively forming second semiconductor layers of a second conductivity type in a surface of said first semiconductor layer;

(c) forming Schottky junction regions in regions of the surface of said first semiconductor layer where said second semiconductor layers are not formed;

(d) forming a barrier metal layer on said second semiconductor layers and said Schottky junction regions;

(e) forming a first main electrode on said barrier metal layer;

(f) forming a second main electrode in a rear surface side of said first semiconductor layer; and (g) bonding a bonding wire onto said first main electrode at a position above at least one of said Schottky junction regions, so that said barrier metal layer intervenes between said bonding wire and said at least one of said Schottky junction regions, wherein said step (c) includes a step of forming platinum silicide films.

7. The method according to claim 6, wherein said step (d) includes the step of forming an alloy layer of titanium and tungsten.

8. The method according to claim 6, further comprising the step of:

(h) diffusing platinum as a lifetime killer into said first semiconductor layer.

9. The method according to claim 6, wherein said barrier metal layer has a sufficient thickness to prevent defects in said Schottky junction regions caused by applied pressure from the bonding of the bonding wire onto the first main electrode.

10. The method according to claim 9, wherein the thickness is about 1500 Å.

* * * * *